US 6,992,890 B2

(12) United States Patent
Wang et al.

(10) Patent No.: US 6,992,890 B2
(45) Date of Patent: Jan. 31, 2006

(54) HEAT SINK

(75) Inventors: Ying-Chih Wang, Taipei (TW);
Yong-Chang Kao, Taipei (TW);
Chi-Nan Tsai, Taipei (TW)

(73) Assignee: Glacialtech, Inc., Taipei Hsien (TW)

( * ) Notice: Subject to any disclaimer, the term of this patent is extended or adjusted under 35 U.S.C. 154(b) by 0 days.

(21) Appl. No.: 10/711,233

(22) Filed: Sep. 2, 2004

(65) Prior Publication Data

US 2005/0264994 A1    Dec. 1, 2005

(30) Foreign Application Priority Data

May 31, 2004  (CN)  ................................ 093208561

(51) Int. Cl.
*H05K 7/20*       (2006.01)
(52) U.S. Cl. ...................... 361/700; 361/695; 361/699; 257/715; 174/15.2; 165/80.4; 165/104.26
(58) Field of Classification Search ................ 361/699, 361/700, 695; 257/715, 721, 722; 174/15.2, 174/16.1, 16.3; 165/80.4, 104.26
See application file for complete search history.

(56) References Cited

U.S. PATENT DOCUMENTS

| 5,529,115 | A | * | 6/1996 | Paterson | ................. | 165/104.33 |
| 6,315,033 | B1 | * | 11/2001 | Li | .......................... | 165/104.33 |
| 6,439,298 | B1 | * | 8/2002 | Li | .......................... | 165/104.33 |
| 6,702,002 | B2 | * | 3/2004 | Wang | ......................... | 165/80.3 |
| 2003/0196778 | A1 | * | 10/2003 | Kobayashi et al. | ........... | 165/41 |
| 2004/0226690 | A1 | * | 11/2004 | Lee et al. | ................... | 165/80.2 |

* cited by examiner

*Primary Examiner*—Boris Chervinsky

(57) ABSTRACT

A heat sink is provided. The heat sink comprises a hollow chassis having a contact face at a bottom portion thereof for attaching to an electronic component and a heat dissipating face at a top portion thereof. A plurality of circularly arranged fins extend from an inner sidewall of the hollow chassis towards a center of the hollow chassis so that gaps between the fins gradually decrease from the inner sidewall of said hollow chassis towards the center of said hollow chassis. At least a heat pipe is positioned between the contact face and the heat dissipating face. At least a fan is positioned at a side of the hollow chassis for generating air to increase an amount of air blowing through wider gaps between said fins to increase the speed of heat dissipation.

5 Claims, 7 Drawing Sheets

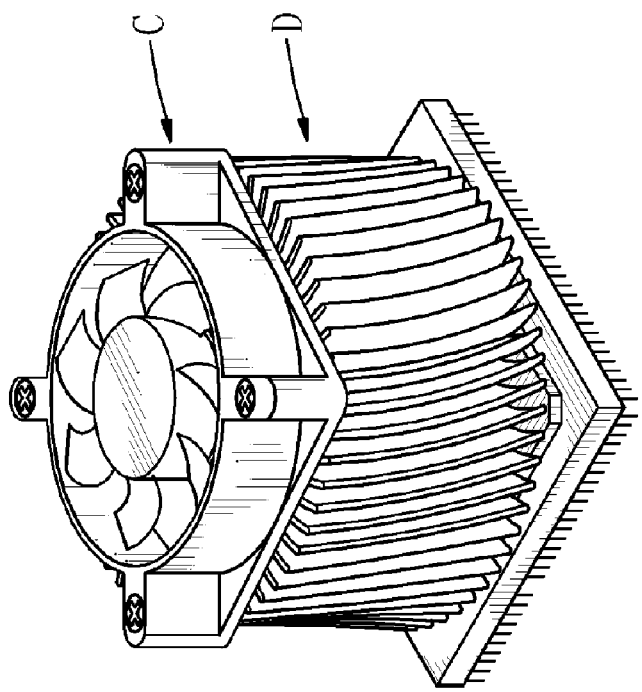

HEAT SINK

This application claims the priority benefit of Taiwan patent application number 093208561 filed on May 31, 2004.

DESCRIPTION

BACKGROUND OF THE INVENTION

1. The Field of the Invention

The present invention relates to a heat sink, and more particularly to a heat sink comprising a plurality circularly arranged fins extending from the inner sidewall of a hollow chassis towards the center of the hollow chassis with gaps there-between so that the width of the gaps gradually decreases from the inner sidewall to the center of the hollow chassis and a fan is used to generate air to increase the amount of air blowing through the wider gaps between the fins in order to increase the speed of heat dissipation.

2. Description of Related Art

The highly developed technology has made it possible to fabricate miniaturized electronic components for increasing the density of the electronic device and the operation efficiency thereof. In such a condition, if heat is not being dissipated properly, more and more heat generated by the operation of the electronic components gets accumulated within the electronic device causing over heating of the electronic device. Over heating may cause ionization and thermal stress to the electronic components and thereby adversely affecting the stability of the electronic components as well as shorten the service life of the electronic components. Therefore, heat dissipation of the heat generated by the operation of the electronic components cannot be ignored.

Nowadays, personal computers are widely used, and with the rapid advancement of the computer technology, newer and faster CPUs are being developed rapidly. The operation of high speed CPU with high efficiency usually generate more heat and because the surface area of the CPU is limited, heat of about 60 to 95° C. may seriously affect the operation of the CPU. Therefore, increasing the heat dissipation efficiency is very important.

Referring to FIG. 6, a conventional heat sink comprises a plurality of fins A and a substrate B. The fins A are positioned on the substrate B and are adapted for dissipating heat and the substrate B is stacked onto the heating object and is adapted for absorbing heat from the heating object. A through channel B1 is formed at a center portion of the substrate B to serve as the heat pipe. The substrate B absorbs heat from the heating object and transfers the heat to the fins A for dissipating heat to outside.

However, in the hollow through channel B1 at the center portion of the substrate B forming the heat pipe is too limited to provide sufficient surface area to efficiently facilitate liquid to gas transformation. In other words, the coolant in the steam state cannot be frozen promptly and thus the heat cannot be efficiently spread due to poor liquid to gas transformation, causing accumulation of heat on the substrate B and thereby adversely affect the stability and the decreasing service life of the heating object.

FIG. 7 discloses yet another conventional heat sink. The heat sink comprises a fan C and a panel D. The panel D is positioned on a surface of a heating object for dissipating heat generated by the heating object and the fan C is positioned above the panel D. The panel D is in a cylindrical shape and has a plurality of smooth spiral fins extending outwardly from a surface thereof for improving heat transfer to the surface of the fins. The rotation angle of the fins is designed to correspond to the rotation of the fan C for increasing heat dissipation. However, the fan C generates cool air and blows towards the panel D, the direction of cool air is directed by the smooth spiral fins which easily diverts the cool air away from the bottom of the panel D. Thus, the cool air cannot be blown to the bottom of the panel D to efficiently dissipate the heat there-from. Accordingly, resolving the defects of the conventional heat sinks described above is highly desirable and very important issue to the manufacturers in this field.

SUMMARY OF THE INVENTION

Accordingly, in the view of the foregoing, the present inventor makes a detailed study of related art to evaluate and consider, and uses years of accumulated experience in this field, and through several experiments to create a new heat sink. The present invention provides an innovated cost effective heat sink capable of increasing the speed of heat dissipation, and also capable of increasing the stability and the service life of the electronic component.

According to an aspect of the present invention, a plurality of circularly arranged fins extending from the inner sidewall of the hollow chassis towards the center portion of the hollow chassis with gaps there-between so that gaps between the fins gradually decreases from the inner sidewall of the hollow chassis towards the center of the hollow chassis is provided. A fan is adapted for generating air to increase the amount of air blowing through the wider gaps between the fins to increase the speed of heat dissipation.

According to another aspect of the present invention, the contact face is adapted for absorbing the heat generated by the operation of the electronic component and the heat pipe is adapted for conducting the heat to uniformly heat the hollow chassis for uniformly transferring the heat to the fins and thereby reduce accumulation of heat on the contact face of the hollow chassis. Therefore, the hollow chassis is capable of uniformly spreading the heat to the plurality of fins. Thus, both the stability and the service life of the electronic component can be effectively increased.

BRIEF DESCRIPTION OF THE DRAWING

For a more complete understanding of the present invention, reference will now be made to the following detailed description of preferred embodiments taken in conjunction with the following accompanying drawings.

FIG. 7 is an elevational view of another convention heat sink.

DETAILED DESCRIPTION OF PREFERRED EMBODIMENTS

Figure 1:
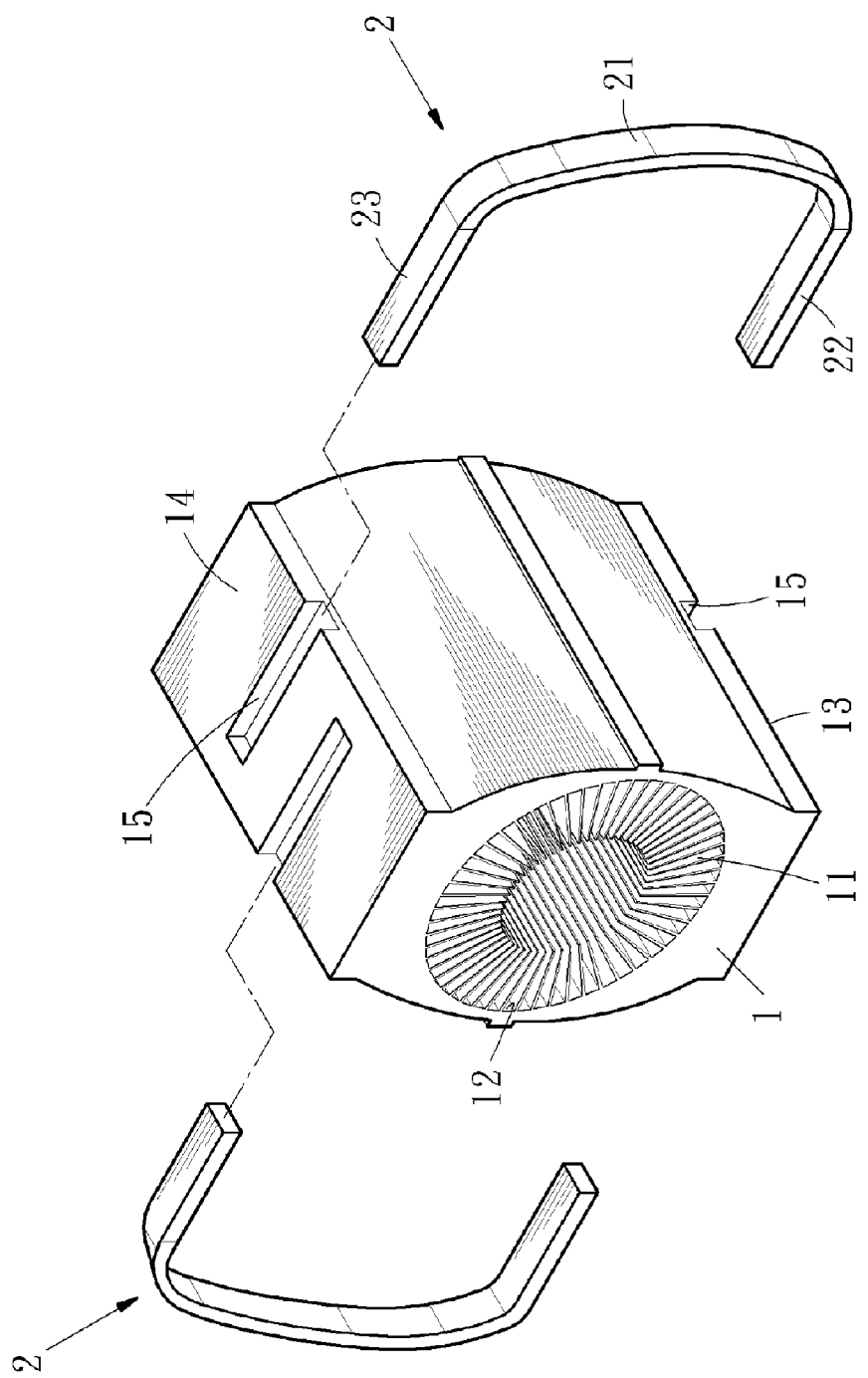
FIG. 1 is an exploded view of a heat sink according to an embodiment of the present invention.

Reference will be made in detail to the preferred embodiments of the invention, examples of which are illustrated in the accompanying drawings. Wherever possible, the same reference numbers are used in the drawings and the description to refer to the same or like parts.

Figure 2:
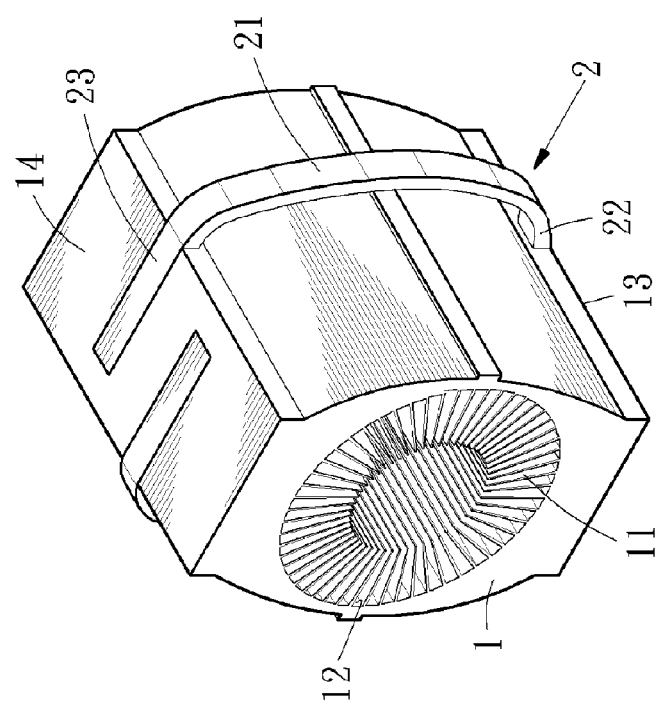
FIG. 2 is an elevational view of a heat sink according to an embodiment of the present invention.
Figure 3:
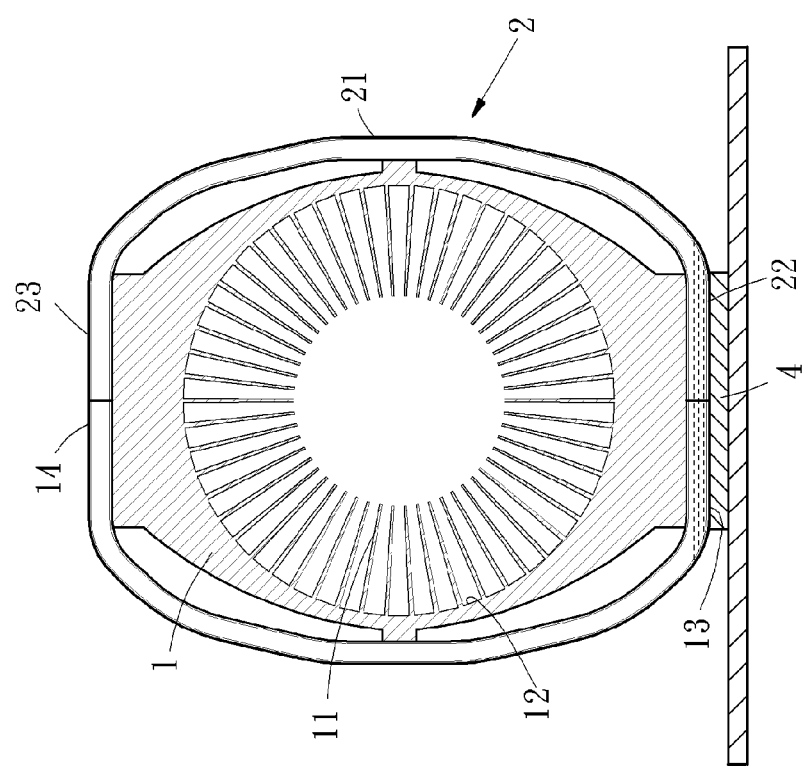
FIG. 3 is a sectional side view of a heat sink according to an embodiment of the present invention.

Referring to FIGS. 1, 2 and 3, the heat sink of the present invention comprises a hollow chassis 1 and a heat pipe 2.

The hollow chassis 1 comprises a plurality of circularly arranged fins 11, each fin 11 being separated from the other with a gap. The fins 11 extend from an inner sidewall 12 of the hollow chassis 1 towards the center of the hollow chassis 1 so that the gap between the fins 11 gradually decreases from the inner sidewall 12 towards the center. The hollow chassis 1 comprises a contact face 13 at a bottom portion thereof for attaching to an electronic component 4 and a heat dissipating face 14 at the top portion thereof. The contact face 13 and the heat dissipating face 14 comprise an inlaying groove 15 respectively.

The heat pipe 2 comprises a base 21, a heat conducting portion 22 and a heat dissipating portion 23 away from the heat conducting portion 22 respectively extending from the base 21. The base 21, the heat conducting portion 22 and the heat dissipating portion 23 are integrally formed in a U shape forming the pipe 2.

The components of the heat sink of the present invention described above can be assembled as follows. The heat pipe 2 is connected to the inlaying groove 15 of the contact face 13 and the heat dissipating face 14 of the hollow chassis 1.

After assembling the hollow chassis 1 and the heat pipe 2 together, the heat conducting portion 22 is then attached on the surface of the electronic component 4. The heat generated by the operation of the electronic component 4 can be quickly absorbed by the contact face 13 and the heat conducting portion 22 simultaneously. The heat conducting portion 22 conducts the heat to a coolant, and as a result the coolant is transformed into steam or gas state after being heated and the steam or the gas carries the heat to the heat dissipating portion 23 and the heat dissipating face 14. Thereafter, the coolant releases the heat and then cools down transforming itself back to the liquid state and flows back to the heat conducting portion 22. Thus, the hollow chassis 1 can be uniformly heated so that the heat can be uniformly conducted to every fin 11 to reduce accumulation of heat on the contact face 13 of the hollow chassis 1 and thus the speed of heat dissipation can be effectively increased. Therefore, the stability of the electronic component 4 as well as the service life of the electronic component 4 can be effectively increased.

Figure 4:
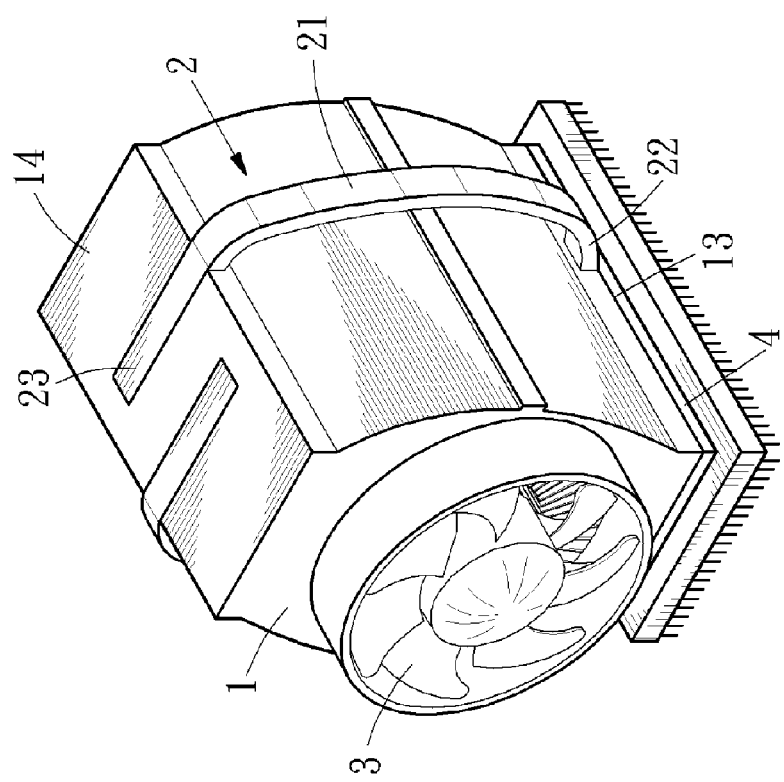
FIG. 4 is an elevational view of a heat sink according to another embodiment of the present invention.

Referring to FIG. 4, the hollow chassis 1 comprises a fan 3 at a side thereof. Because the flange side of the fan panel of the fan 3 generates large amount of air compared to that at the center of the fan 3, maximum amount of the air generated by the fan 3 can be effectively blown into the wider gaps between the fins 11. Thus, the heat generated due to the operation of the electronic component 4 can be dissipated quickly. Therefore, by including the fan 3, the speed and efficiency of heat dissipation can be further increased.

Figure 5:
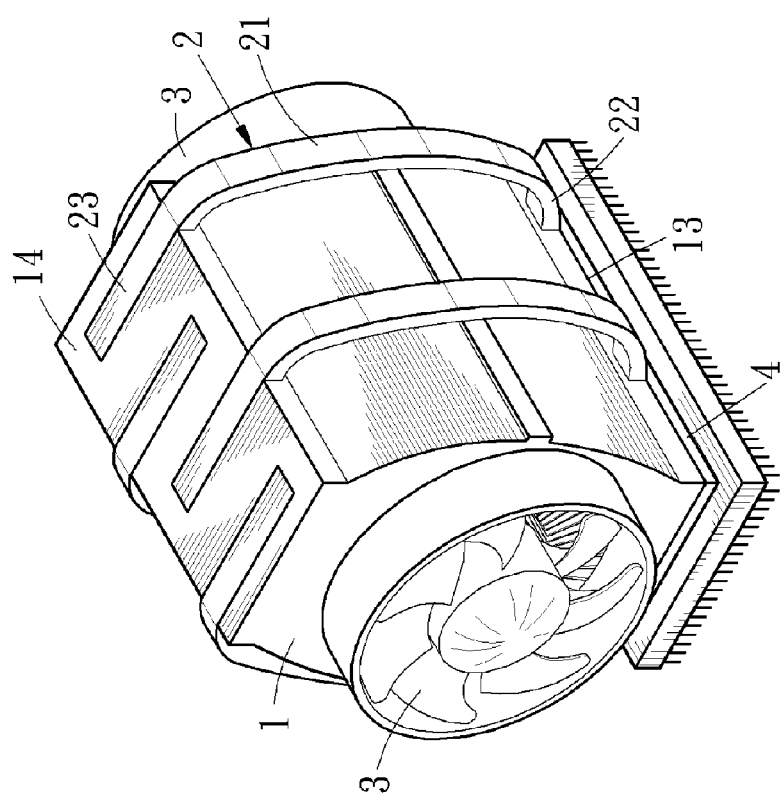
FIG. 5 is an elevational view of a heat sink according to the other embodiment of the present invention.
Figure 6:
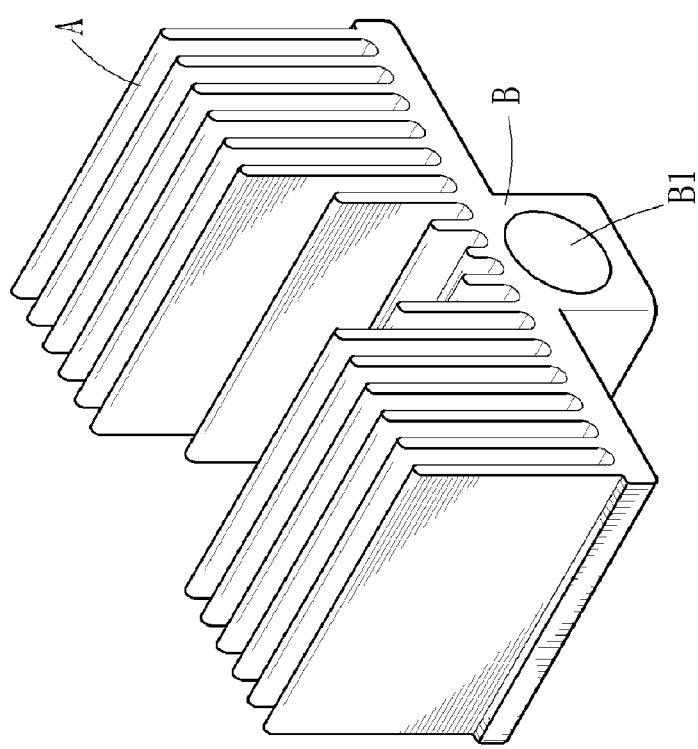
FIG. 6 is an elevational view of a conventional heat sink.

Furthermore, referring to FIG. 5, a plurality of heat pipe 2 can be assembled to the hollow chassis 1, and the hollow chassis 1 comprises an opening at the two sides of where the fan 3 can be respectively installed therein. Thus, one of the fans 3 at one side can be adapted for sucking air from outside while the other fan 3 at the other side can be adapted for blowing the air to outside for increasing the amount of air blowing through the fin 11 and thereby increasing the heat dissipation efficiency.

Accordingly, the heat sink of the present invention has following advantages:

The hollow chassis 1 comprises a plurality of circularly arranged fins 11 with gaps there-between. The fins 11 extend from the inner sidewall 12 of the hollow chassis 1 towards the center of the hollow chassis 1 so that the gap between the fins gradually decreases from the inner sidewall 12 of the hollow chassis 1 to the center of the hollow chassis 1. The fan 3 is adapted to generate air to increase the amount of air blowing through the wider gaps between the fins 11 and thereby increase both the efficiency and speed of heat dissipation.

The contacting face 13 is adapted for absorbing the heat generated by the operation of the electronic component 4 and the heat pipe 2 is adapted for conducting the heat to the heat dissipating face 14 and thus the heat can be uniformly transferred to the hollow chassis 1 and the heat can be uniformly conducted to the fins to reduce accumulation of heat on the contact face 13 of the hollow chassis 1. Therefore, the hollow chassis 1 is capable of evenly spreading the heat to the plurality of fins 11 to promote the stability of the electronic component 4 and the service life of the electronic component 4 are also increased.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

What is claimed is:

1. A heat sink, comprising:
a hollow chassis, comprising a contact face at a bottom portion thereof for attaching to an electronic component and a heat dissipating face at a top portion thereof, and a plurality of circularly arranged fins extending from an inner sidewall of said hollow chassis towards a center of said hollow chassis so that gaps between said fins gradually decrease from said inner sidewall of said hollow chassis towards said center of said hollow chassis; and at least a heat pipe, positioned between said contact face and said heat dissipating face, wherein at least a fan is positioned at a side of said hollow chassis for generating air to increase an amount of air blowing through wider gaps between said fins to increase a speed of heat dissipation.

2. The heat sink according to claim 1, wherein said heat pipe comprises a base, and a heat conducting portion and a heat dissipating portion away from said heat conducting portion respectively extending from said base, and wherein said heat conducting portion and said heat dissipating portion are respectively attached in said contact face and said heat dissipating face of said hollow chassis.

3. The heat sink according to claim 1, wherein said heat sink comprises one or more heat pipes.

4. The heat sink according to claim 1, wherein said contact face and said heat dissipating face of said hollow chassis have inlaying groove respectively for inlaying said heat conducting portion and said heat dissipating portion of said heat pipe.

5. The heat sink according to claim 1, wherein said hollow chassis comprises a fan at two sides thereof respectively, and wherein said fan at one side is adapted for sucking air from outside and said fan at the other side is adapted for blowing air to outside.

* * * * *